United States Patent
Lee et al.

(10) Patent No.: US 7,199,675 B2
(45) Date of Patent: Apr. 3, 2007

(54) SOURCE-INJECTION PARALLEL COUPLED LC-QUADRATURE VOLTAGE CONTROLLED OSCILLATOR

(75) Inventors: Sang Gug Lee, Daejeon (KR); So Bong Shin, Daejeon (KR); Hyoung Chul Choi, Daejeon (KR)

(73) Assignee: Information and Communication University Research and Industrial Cooperation Group, Daejeon (KR)

( * ) Notice: Subject to any disclaimer, the term of this patent is extended or adjusted under 35 U.S.C. 154(b) by 0 days.

(21) Appl. No.: 10/915,850

(22) Filed: Aug. 11, 2004

(65) Prior Publication Data
US 2005/0035823 A1 Feb. 17, 2005

(30) Foreign Application Priority Data
Aug. 11, 2003 (KR) ............ 10-2003-0055429

(51) Int. Cl.
*H03B 5/12* (2006.01)
(52) U.S. Cl. ................ 331/117 FE; 331/167
(58) Field of Classification Search ........... 331/117 R, 331/117 FE, 167
See application file for complete search history.

(56) References Cited

U.S. PATENT DOCUMENTS

| 6,317,008 | B1 * | 11/2001 | Gabara ............ 331/117 R |
| 6,456,167 | B1 * | 9/2002 | Huang ............ 331/46 |
| 6,583,675 | B2 * | 6/2003 | Gomez ............ 331/17 |
| 6,650,195 | B1 * | 11/2003 | Brunn et al. ........ 331/177 V |
| 6,667,668 | B1 * | 12/2003 | Henrion ............ 332/149 |
| 6,867,656 | B2 * | 3/2005 | Hajimiri et al. ....... 331/45 |
| 6,906,596 | B2 * | 6/2005 | Kitamura et al. ...... 331/36 C |
| 7,034,626 | B2 * | 4/2006 | Akeyama et al. ..... 331/117 FE |
| 2005/0046494 | A1 * | 3/2005 | Lee et al. ............ 331/46 |

FOREIGN PATENT DOCUMENTS

| JP | 2001-111341 | 4/2001 |
| JP | 2002-208818 | 7/2002 |

* cited by examiner

*Primary Examiner*—Robert Pascal
*Assistant Examiner*—James Goodley
(74) *Attorney, Agent, or Firm*—Alston & Bird LLP

(57) ABSTRACT

A quadrature VCO comprises: a first delay cell including a first differential VCO coupled between a power supply and a first current source; and first and second coupling transistors that each include a first terminal, a second terminal coupled to the power supply, and a third terminal, and that vary a current flowing from the second terminal to the third terminal according to quadrature-phase signals applied to the first terminal; and a second delay cell including a second differential VCO coupled between a power supply and a second current source; and third and fourth coupling transistors that each include a first terminal, a second terminal coupled to the power, and a third terminal, and that vary a current flowing from the second terminal to the third terminal according to in-phase signals applied to the first terminal.

4 Claims, 6 Drawing Sheets

SOURCE-INJECTION PARALLEL COUPLED LC-QUADRATURE VOLTAGE CONTROLLED OSCILLATOR

CROSS REFERENCE TO RELATED APPLICATION

This application claims priority to and the benefit of Korea Patent Application No. 10-2003-0055429 filed on Aug. 11, 2003 in the Korean Intellectual Property Office, the entire content of which is incorporated herein by reference.

BACKGROUND OF THE INVENTION (a) Field of the Invention

The present invention relates to a voltage controlled oscillator. More specifically, the present invention relates to a voltage controlled oscillator with lower power and low phase noise.

(b) Description of the Related Art

A quadrature VCO (voltage controlled oscillator) is a circuit for generating four kinds of signals with the same magnitude but delays of 90 degrees respectively, and is generally applied to direct conversion transmitters and receivers. Direct conversion is a method for converting RF (radio frequency) signals into baseband signals without converting them into IF (intermediate frequency) signals, and is being actively developed since it reduces the number of external components such as filters, and decreases digital signal processing loads. Direct conversion is the most suitable method for a single chip manufacturing process using the CMOS process which easily realizes digital circuits.

FIG. 1 shows a block diagram of a quadrature VCO.

As shown, the quadrature VCO comprises first and second coupled delay cells 110 and 130.

In detail, signals output by (−) and (+) output terminals of the first delay cell 110 are applied to (+) and (−) input terminals of the second delay cell 130, and signals output by (−) and (+) output terminals of the second delay cell 130 are applied to (−) and (+) input terminals of the first delay cell 110.

According to the above-noted configuration, the (−) and (+) output terminals of the first delay cell 110 output signals with the same magnitude and phases of 90° and 270°, and the (+) and (−) output terminals of the second delay cell 130 output signals with the same magnitude and phases of 0° and 180°.

FIG. 2 shows a detailed diagram of a conventional circuit used as the first and second delay cells in the quadrature VCO of FIG. 1.

As shown in FIG. 2, the first and second delay cells 110 and 130 comprise differential VCOs (voltage controlled oscillators) 210 and 230 for varying frequencies of output signals according to a control voltage Vctrl, and fifth to eighth NMOS transistors MN25 to MN28 for coupling the first and second delay cells 110 and 130, the configuration and operation of which will now be described.

The differential VCO 210 of the first delay cell 110 comprises first and second NMOS transistors MN21 and MN22, first and second inductors L21 and L22, and first and second varactors Cv21 and Cv22, and the differential VCO 230 of the second delay cell 130 comprises third and fourth NMOS transistors MN23 and MN24, third and fourth inductors L23 and L24, and third and fourth varactors Cv23 and Cv24.

The first to fourth NMOS transistors MN21 to MN24 generate negative resistance of the differential VCOs 210 and 230, and are cross-coupled.

The first to fourth inductors L21 to L24 and the first to fourth varactors Cv21 to Cv24 form an LC tank, and vary impedance of the LC tank according to the applied control voltage of Vctrl, thereby varying the frequency of output signals.

In the conventional quadrature voltage controlled oscillator shown in FIG. 2, the fifth to eighth NMOS transistors MN25 to MN28 which are coupling transistors are respectively coupled in parallel to a drain and a source of the first to fourth NMOS transistors MN21 to MN24. In detail, drains of the fifth to eighth NMOS transistors MN25 to MN28 are respectively coupled to the drains of the first to fourth NMOS transistors MN21 to MN24, and sources thereof are coupled to the sources of the first to fourth NMOS transistors MN21 to MN24.

Also, the (+) and (−) output signals Q+ and Q− of the second delay cell 130 are applied to gates of the fifth and sixth NMOS transistors MN25 and MN26 of the first delay cell 110, and (−) and (+) output signals I− and I+ of the first delay cell 110 are applied to gates of the seventh and eighth NMOS transistors MN27 and MN28 of the second delay cell 130.

The conventional quadrature VCO shown in FIG. 2 outputs four kinds of signals with the same magnitude but different phases through a relatively easy method, but it has a problem in that low-frequency noise generated by the fifth to eighth NMOS transistors MN25 to MN28 is directly induced to the inductor of the LC tank and the frequency is accordingly transited. This problem deteriorates a phase noise characteristic of the quadrature VCO and increases more phase noise than the phase noise characteristic of the differential VCO.

To solve the problem, another quadrature VCO has been proposed.

FIG. 3 shows a circuit diagram of another conventional quadrature VCO.

As shown in the conventional quadrature VCO, the fifth to eighth NMOS transistors MN35 to MN38 which are the coupling transistors are coupled in series to the first to fourth NMOS transistors MN31 to MN34.

In detail, drains of the fifth to eighth NMOS transistors MN35 to MN38 are coupled to output terminals, and sources thereof are coupled to drains of the first to fourth NMOS transistors MN31 to MN34. The (+) and (−) output signals Q+ and Q− of the second delay cell are respectively applied to the gates of the fifth and sixth NMOS transistors MN35 and MN 36, and (−) and (+) output signals I− and I+ of the first delay cell are applied to the gates of the seventh and eighth NMOS transistors MN37 and MN38.

The phenomenon that the phase noise characteristic is deteriorated is improved in the above-mentioned quadrature VCO since the low-frequency noise signals generated by the fifth to eighth NMOS transistors MN35 to MN38 are transited to a double frequency of the output signal. However, the quadrature VCO shown in FIG. 3 requires a high supply voltage since the fifth to eighth NMOS transistors MN35 to MN38 are coupled in series to the first to fourth NMOS transistors MN31 to MN34.

SUMMARY OF THE INVENTION

It is an advantage of the present invention to provide a quadrature voltage controlled oscillator for eliminating low-frequency noise from a coupling transistor.

It is another advantage of the present invention to provide a quadrature voltage controlled oscillator operable at a low supply voltage.

In one aspect of the present invention, provided is a quadrature VCO comprising a first delay cell for outputting a first in-phase signal and a second in-phase signal with different phases, and a second delay cell for outputting a first quadrature-phase signal and a second quadrature-phase signal with different phases.

The first delay cell comprises: a first differential VCO coupled between a power supply and a first current source; and a first coupling transistor and a second coupling transistor that each includes a first terminal, a second terminal coupled to the power supply, and a third terminal, the first and second coupling transistors varying a magnitude and a direction of a current which flows from the second terminal to the third terminal according to magnitudes of the first and second quadrature-phase signals respectively applied to the first terminal.

The second delay cell comprises: a second differential VCO coupled between a power supply and a second current source; and a third coupling transistor and a fourth coupling transistor including a first terminal, a second terminal coupled to the power supply, and a third terminal, the third and fourth coupling transistors varying a magnitude and a direction of a current which flows from the second terminal to the third terminal according to magnitudes of the second and first in-phase signals respectively applied to the first terminal.

In one embodiment, the third terminals of the first and second coupling transistors are coupled to the first current source, and the third terminals of the third and fourth coupling transistors are coupled to the second current source.

The first differential VCO may comprise: a first switching transistor including a first terminal, a second terminal for outputting the first in-phase signal, and a third terminal coupled to the first current source, the first switching transistor varying a magnitude and a direction of a current which flows from the second terminal to the third terminal according to a voltage applied to the first terminal; a second switching transistor including a first terminal coupled to the second terminal of the first switching transistor, a second terminal being coupled to the first terminal of the first switching transistor and outputting the second in-phase signal, and a third terminal coupled to the first current source, the second switching transistor varying a magnitude and a direction of a current which flows from the second terminal to the third terminal according to a voltage applied to the first terminal; and an LC resonance circuit coupled between the second terminals of the first and second switching transistors and the power supply.

The second differential VCO may comprise: a third switching transistor including a first terminal, a second terminal for outputting the first quadrature-phase signal, and a third terminal coupled to the second current source, the third switching transistor varying a magnitude and a direction of a current which flows from the second terminal to the third terminal according to a voltage applied to the first terminal; a fourth switching transistor including a first terminal coupled to the second terminal of the third switching transistor, a second terminal being coupled to the first terminal of the third switching transistor and outputting the second quadrature-phase signal, and a third terminal coupled to the second current source, the fourth switching transistor varying a magnitude and a direction of a current which flows from the second terminal to the third terminal according to a voltage applied to the first terminal; and an LC resonance circuit coupled between the second terminals of the third and fourth switching transistors and the power supply.

The LC resonance circuit of the first differential VCO may comprise: a first inductor and a second inductor respectively coupled between the power supply and the second terminals of the first and second switching transistors; and a first varactor and a second varactor having one terminal coupled to the second terminals of the first and second switching transistors and another terminal coupled to each other, a node of the other terminals receiving a control voltage for controlling frequencies of output signals of the first and second in-phase output signals.

In one embodiment, the LC resonance circuit of the second differential VCO comprises: a third inductor and a fourth inductor respectively coupled between the power and the second terminals of the third and fourth switching transistors; and a third capacitor and a fourth capacitor having one terminal coupled to one terminal of the third and fourth inductors and other terminals coupled to each other, a node of the other terminals receiving a control voltage for controlling frequencies of output signals of the first and second quadrature-phase output signals.

The first to fourth switching transistors and the first to fourth coupling transistors include NMOS transistors, the first terminal is a gate, the second terminal is a drain, and the third terminal is a source.

In another embodiment, the first to fourth switching transistors and the first to fourth coupling transistors include PMOS transistors, the first terminal is a gate, the second terminal is a source, and the third terminal is a drain.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
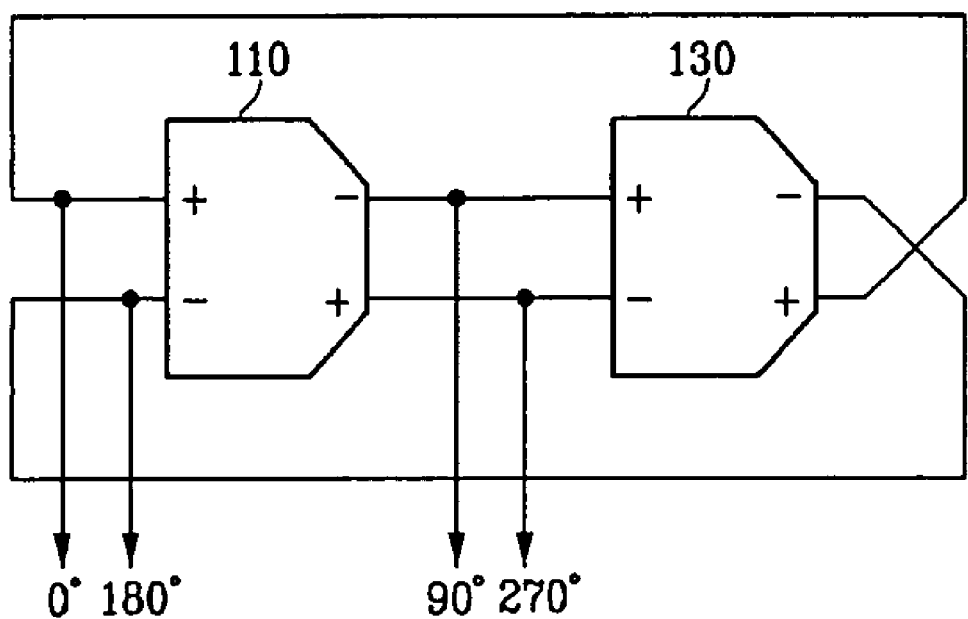
FIG. 1 shows a block diagram of a quadrature VCO.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

The quadrature VCO (voltage controlled oscillator) according to the preferred embodiment of the present invention will be described in detail with reference to drawings.

The quadrature VCO uses eight active elements MN41 to MN44 and MN51 to MN55. Each active element MN comprises a gate, a source, and a drain. Magnitudes and directions of the current which flows from the drain to the source and vice versa of the active element are determined according to the magnitude and polarity of the voltage applied between the gate and the source. The active element includes a BJT (bipolar junction transistor), a JFET (junction field-effect transistor), a MOSFET (metal-oxide semiconductor field-effect transistor), and a MESFET (metal semiconductor field-effect transistor).

Another active element further comprises a body terminal in addition to the gate, the source, and the drain, and it has a characteristic in which amounts and directions of the current which flows from the source to the drain and vice versa vary according to the magnitude and the polarity of the voltage applied between the gate and the body terminal. This kind of active element includes the MOSFET.

The preferred embodiment will now be described with reference to the MOSFET, and the scope of the present invention is applicable to any types of active elements which have the above-described characteristic as well as the MOSFET. Accordingly, the concept and the range of the present invention are not restricted to the MOSFET.

Also, the preferred embodiment using n-type MOSFETS will be described, which is for ease of description, and the scope of the present invention is not restricted to a specific type of MOSFETs, and it is obvious for a person skilled in the art to realize substantially the same operation by using p-type MOSFETs.

Figure 4:
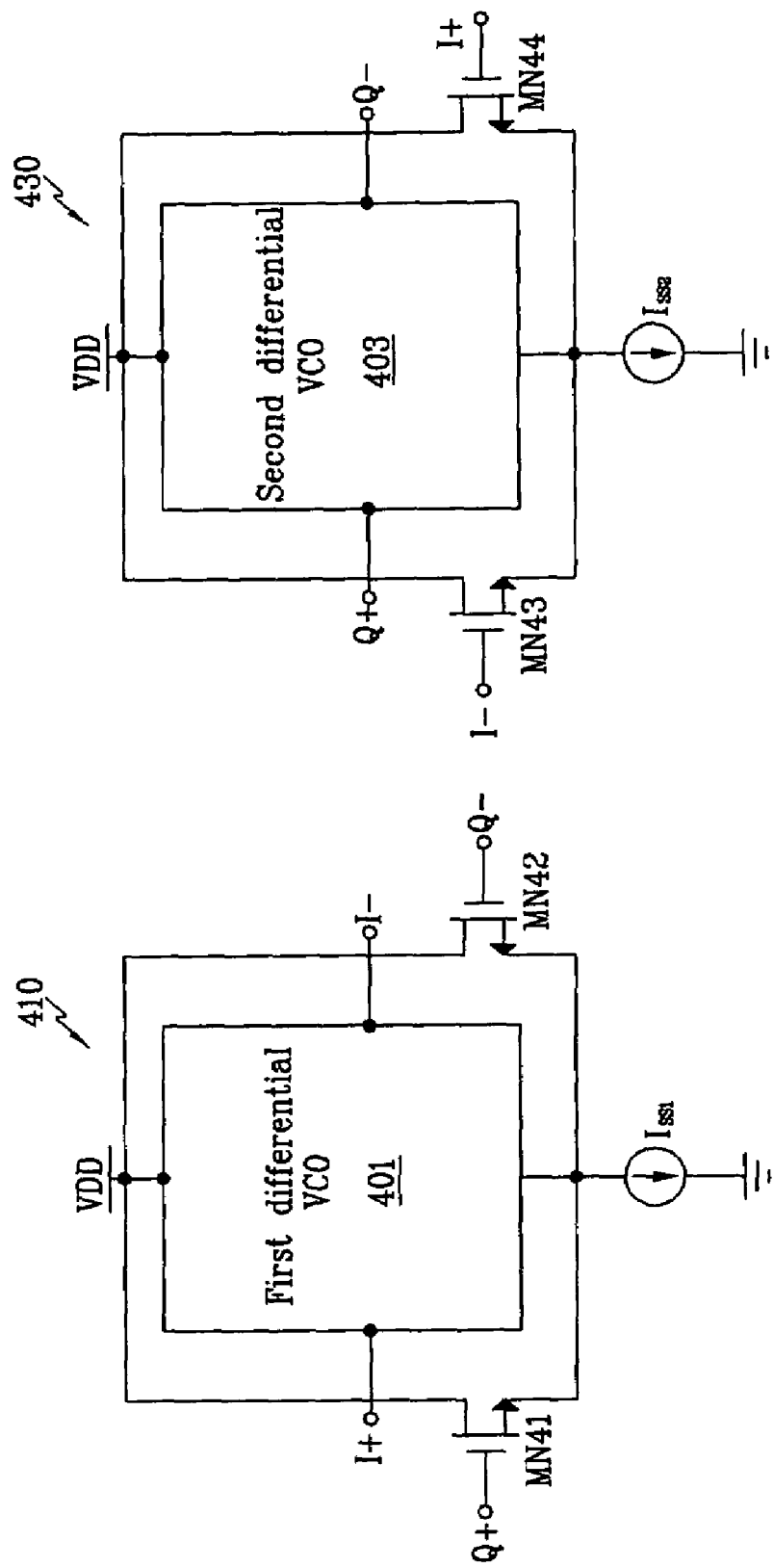
FIG. 4 shows a brief block diagram of a quadrature VCO according to a preferred embodiment of the present invention.

FIG. 4 shows a brief block diagram of a quadrature VCO according to a preferred embodiment of the present invention.

As shown, the quadrature VCO comprises first and second delay cells 410 and 430.

The first delay cell 410 outputs (+) and (−) in-phase signals with substantially the same magnitude, and a phase difference of substantially 90° therebetween. The second delay cell 430 outputs (+) and (−) quadrature-phase signals with substantially the same magnitude, and a phase difference of substantially 90° therebetween.

The first delay cell 410 and the second delay cell 430 are coupled with each other as shown in FIG. 4, and output signals of the second delay cell 430, that is, the (+) and (−) quadrature-phase signals Q+ and Q−, are applied to the first delay cell 410, and output signals of the first delay cell 410, that is, the (+) and (−) in-phase signals I+ and I−, are applied to the second delay cell 430.

The coupled relation of the above configuration will now be described.

The first delay cell 410 comprises a first differential VCO 401, first and second coupling transistors MN41 and MN42, and a tail current source Iss1. The first differential VCO 401 is coupled between a power supply voltage VDD and the tail current source Iss1, and outputs signals of a predetermined frequency according to an applied control voltage (not illustrated.) Drains of the first and second coupling transistors MN41 and MN42 are coupled to the power supply voltage VDD, and sources thereof are coupled to each other and coupled to the tail current source Iss1. The (+) and (−) output signals Q+ and Q− of the second delay cell 430 are applied to the gates of the first and second coupling transistors MN41 and MN42.

The second delay cell 430 comprises a second differential VCO 403, first and second coupling transistors MN43 and MN44, and a tail current source Iss2. The second differential VCO 403 is coupled between a power supply voltage VDD and the tail current source Iss2, and outputs signals of a predetermined frequency according to an applied control voltage (not illustrated.) Drains of the first and second coupling transistors MN43 and MN44 are coupled to the power supply voltage VDD, and sources thereof are coupled to each other and coupled to the tail current source Iss2. The (−) and (+) output signals I− and I+ of the first delay cell 410 are applied to the gates of the first and second coupling transistors MN43 and MN44.

The drain of the coupling transistor in quadrature VCO is directly coupled to the power supply voltage without passing through the inductor of the differential VCO. Therefore, the power supply voltage in the RF substantially corresponds to the ground state, and the problem in which the low-frequency noise generated by the coupling transistor is transited to the operational frequency is solved.

Figure 5:
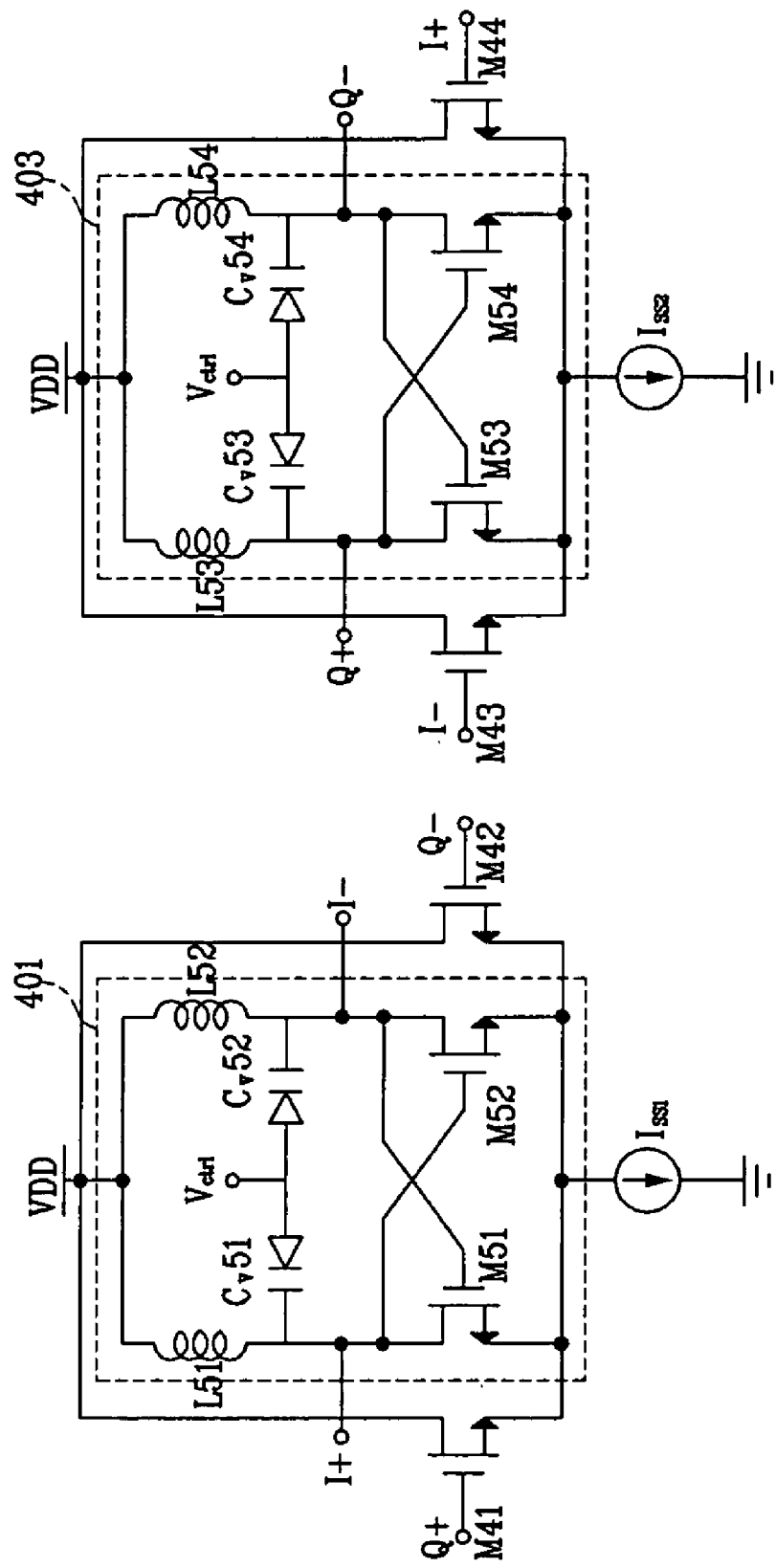
FIG. 5 shows a further detailed circuit diagram of the quadrature VCO shown in FIG. 4.

FIG. 5 shows a further detailed circuit diagram of the quadrature VCO shown in FIG. 4.

As shown, the first differential VCO 401 in the first delay cell 410 comprises first and second switching transistors MN51 and MN52, first and second inductors L51 and L52, and first and second varactors Cv51 and Cv52. The second differential VCO 403 in the second delay cell 430 comprises first and second switching transistors MN53 and MN54, first and second inductors L53 and L54, and first and second varactors Cv53 and Cv54.

Their coupled relation and operation will now be described with reference to the first delay cell 430 since the configuration of the second delay cell 410 substantially corresponds to that of the first delay cell 410.

The first and second switching transistors MN51 and MN52 are cross-coupled to generate negative resistance of the VCO 401. In detail, the gate of the first switching transistor MN51 is coupled to the drain of the second switching transistor MN52, the drain thereof is coupled to the gate of the second switching transistor MN52, and sources are coupled to each other.

Also, the sources of the first and second transistors MN51 and MN52 and the first and second coupling transistors MN41 and MN42 are coupled to each other and are coupled to the tail current source Iss1.

The first and second inductors L51 and L52 and the first and second varactors Cv51 and Cv52 form an LC tank, and they are resonated with each other to thereby output an oscillation signal. In this instance, the frequency of the oscillation signal is varied by the impedance of the LC tank, and in detail, the capacitance of the first and second varactors Cv51 and Cv52 is varied by the control voltage of Vctrl.

The operation of the quadrature VCO will now be described in detail.

When the differential VCO 401 of the first delay cell 410 is oscillated at a specific operational frequency $\omega_0$, a corresponding oscillation signal is applied to the second delay cell 430 through the first and second coupling transistors MN43 and MN44 of the second delay cell 430. In this case, a differential output signal of the differential VCO 401 is superimposed on a common source node B of the differential VCP 403 through the first and second coupling transistors MN43 and MN44 of the second delay cell 430 which performs a common drain operation. The signal superimposed on the common source node B is to be double, and it follows the voltage rise of a source node A of the first and second switching transistors M51 and M52 of the first delay cell 410, but it fails to be reduced below a predetermined value in the actual signal operation. As a result, the oscillation signal with the double frequency $2\omega_0$ is generated on the common source node B of the second delay cell 430.

In a like manner, the output signals Q+ and Q− of the second delay cell 430 are transmitted to the first delay cell 410 through the first and second coupling transistors MN41 and MN42, and an oscillation signal with the double frequency $2\omega_0$ is generated on the common source node of the first delay cell 410.

In this case, the oscillation signals $2\omega_0$ generated on the respective common source nodes A and B have the phase difference of 180° as the first and second differential VCOs 401 and 403 are cross-coupled. Also, it is known that frequencies of the oscillation signals $2\omega_0$ with the phase difference of 180 generated on the common source nodes A and B are reduced to half on the drain node, and hence, the output terminal of the first delay cell 410 outputs a signal of $\omega_0$ with the phase difference of 90° ($\cos((2\omega_0+180)/2=\cos(\omega_0+90))$) (Jose Cabanillas, Laurant Dussopt, Jose M. Lopez-Villegas, and Gabriel M. Rebeiz, "A 900 MHz Low Phase Noise CMOS Quadrature Oscillator," 2002 IEEE RFIC Symposium, pp. 63–66).

Therefore, quadrature output signals with the gap of 90° are generated by the first and second delay cells 410 and 430.

According to the preferred embodiment, since the drains of the coupling transistors are directly coupled to the power supply voltage, the low-frequency noise caused by the coupling transistors is induced to the inductors of the LC tank of the differential VCO, and it is accordingly prevented from transitting the low-frequency noise into the operational frequency. Therefore, the phase noise caused by the coupling transistor is eliminated, and the quadrature VCO with an excellent phase noise characteristic is realized. Also, quadrature oscillation signals are generated by coupling the output signal generated at one delay cell to the common source node through the coupling transistor.

Therefore, the present invention is applicable to configurations in which the output signal generated by one delay cell is coupled to the common source terminal of another delay cell through a coupling transistor having a common drain, and is not restricted to the circuit of FIG. 5.

Figure 6:
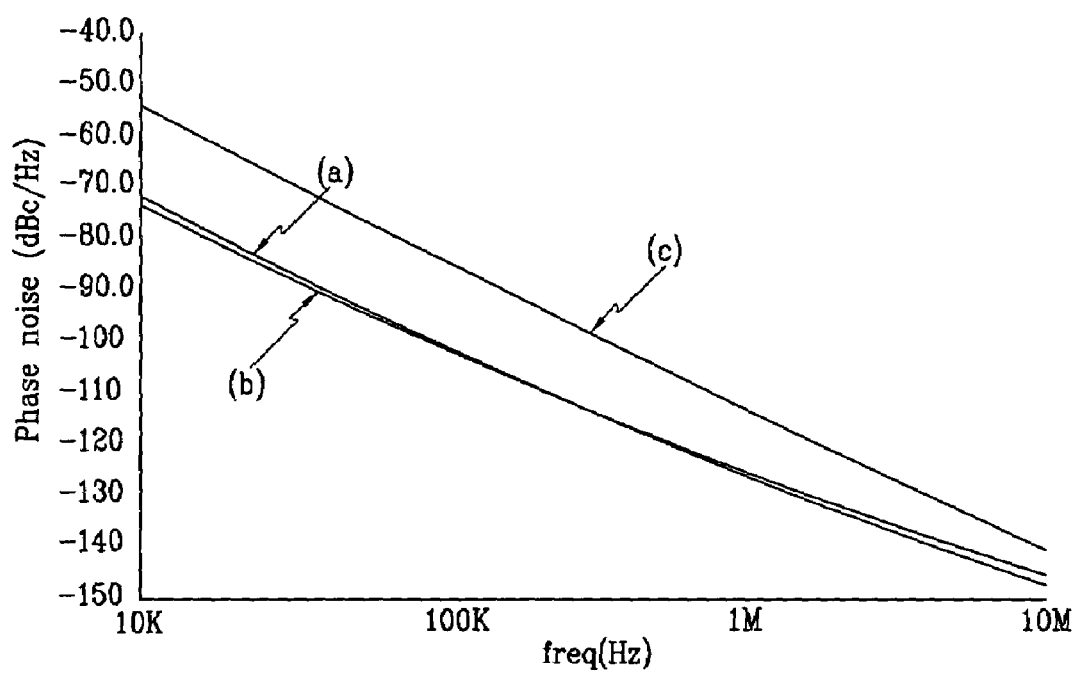
FIG. 6 shows a waveform diagram of a phase noise characteristic of the quadrature VCO through a simulation.

FIG. 6 shows a waveform diagram of a phase noise characteristic of the quadrature VCO through a simulation.

Figure 2:
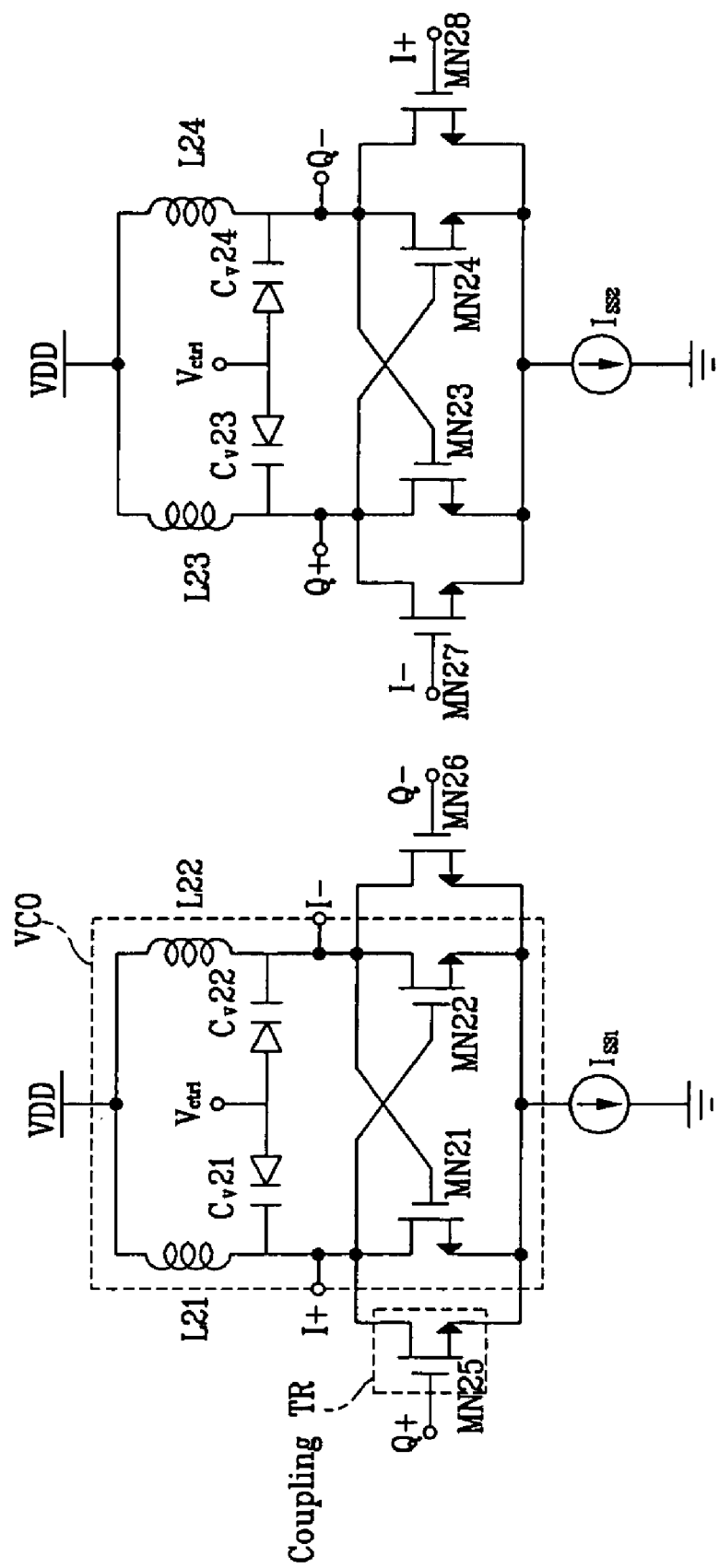
FIG. 2 shows a detailed diagram of a conventional circuit used as the first and second delay cells in the quadrature VCO of FIG. 1.
Figure 3:
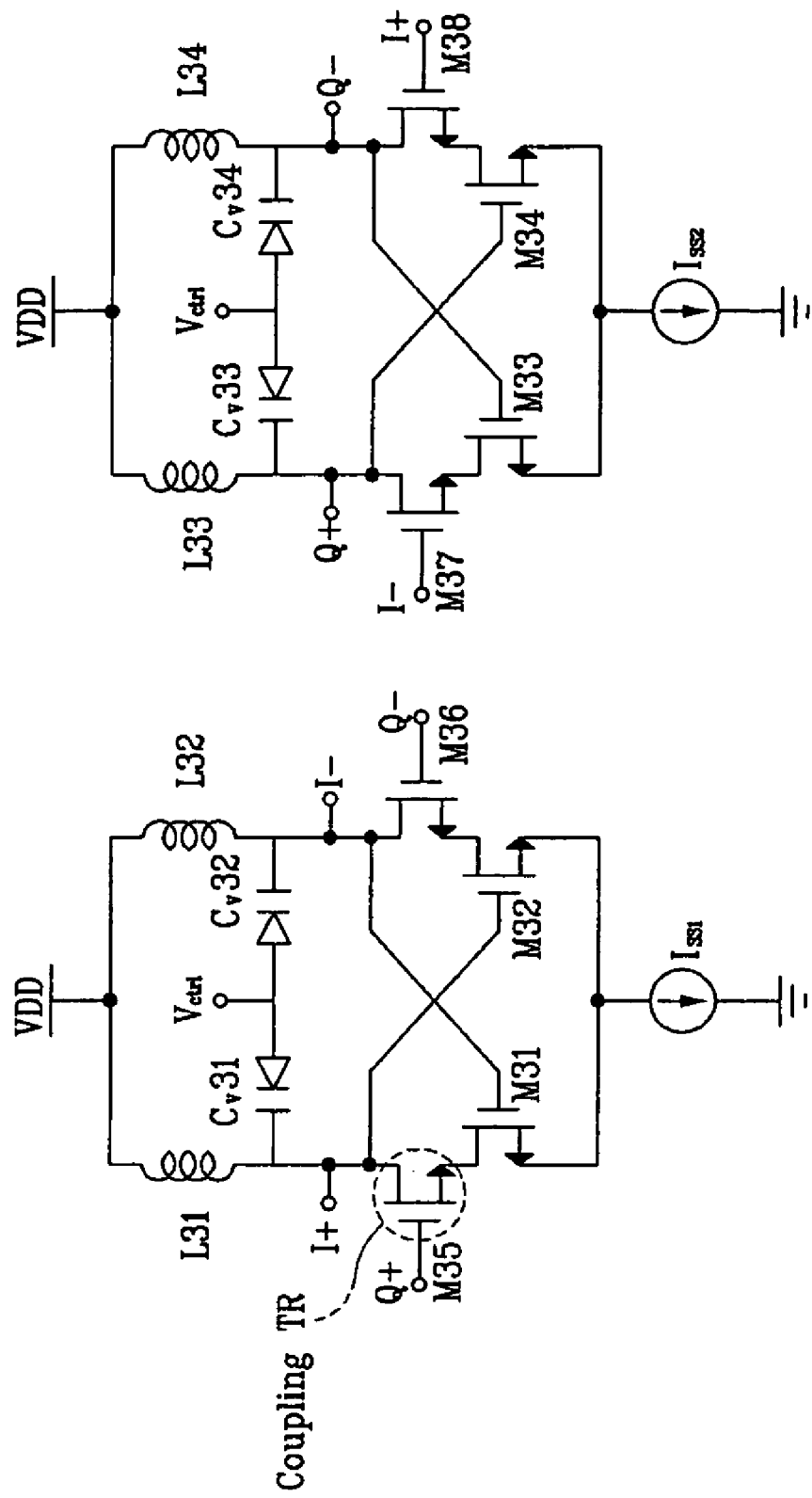
FIG. 3 shows a circuit diagram of another conventional quadrature VCO.

The waveform (a) of FIG. 6 shows a phase noise characteristic with respect to the quadrature VCO according to the preferred embodiment, the waveform (b) shows a phase noise characteristic of the quadrature VCO, and the waveform (c) shows a phase noise characteristic according to the frequency of the conventional quadrature VCO shown in FIG. 2.

As shown in FIG. 6, the simulation result shows that the phase noise characteristic of the quadrature VCO according to the preferred embodiment has almost the same value as those of the general differential VCO, and the conventional quadrature VCO has phase noise differences of from 10 to 20 dB according to frequency offsets compared to the quadrature VCO according to the preferred embodiment. For the purpose of fair simulation, bias conditions of the transistors used for the simulation per oscillator are controlled to be the same, and hence, degrees of the low-frequency noise generated from the respective transistors are the same. The capacitance of the LC resonance circuit is corrected in order to measure the output signals generated by the respective oscillators at the same frequency.

According to the present invention, the low-frequency noise generated by the coupling transistors of the quadrature VCO is eliminated, and the quadrature VCO is operable at a low supply voltage.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A quadrature VCO (voltage controlled oscillator) comprising a first delay cell for outputting a first in-phase signal and a second in-phase signal with different phases, and a second delay cell for outputting a first quadrature-phase signal and a second quadrature-phase signal with different phases, wherein the first delay cell comprises:

a first differential VCO coupled between a power supply and a first current source, the first differential VCO comprising a LC resonance circuit;

a first coupling transistor including a first terminal, a second terminal directly coupled to the power supply, and a third terminal coupled to the first current source, the first coupling transistor varying a magnitude and a direction of a current which flows from the second terminal to the third terminal according to a magnitude of the first quadrature-phase signal applied to the first terminal; and a second coupling transistor including a first terminal, a second terminal directly coupled to the power supply, and a third terminal coupled to the first current source, the second coupling transistor varying a magnitude and a direction of a current which flows from the second terminal to the third terminal according to a magnitude of the second quadrature-phase signal applied to the first terminal, and wherein the LC resonance circuit of the first differential VCO comprises;

a first inductor coupled between the power and the first in-phase signal;

a second inductor coupled between the power and the second in-phase signal;

a first varactor having a first terminal coupled to the first in-phase signal and a second terminal for receiving a first control voltage for controlling frequencies of the first in-phase signal and the second in-phase signal; and a second varactor having a first terminal coupled to the second in-phase signal and a second terminal for receiving the first control voltage, and wherein the second delay cell comprises:

a second differential VCO coupled between a power supply and a second current source, the second differential VCO comprising a LC resonance circuit;

a third coupling transistor including a first terminal, a second terminal directly coupled to the power supply, and a third terminal coupled to the second current source, the third coupling transistor varying a magnitude and a direction of a current which flows from the second terminal to the third terminal according to a magnitude of the second in-phase signal applied to the first terminal; and a fourth coupling transistor including a first terminal, a second terminal directly coupled to the power supply, and a third terminal coupled to the second current source, the third coupling transistor varying a magnitude and a direction of a current which flows from the second terminal to the third terminal according to a magnitude of the first in-phase signals applied to the first terminal, and wherein the LC resonance circuit of the second differential VCO comprises:

a third inductor coupled between the power and the first quadrature-phase signal;

a fourth inductor coupled between the power and the second quadrature-phase signal;

a third varactor having a first terminal coupled to the first quadrature-phase signal and a second terminal receiving a second control voltage for controlling frequencies of the first quadrature-phase signal and the second quadrature-phase signal; and a fourth varactor having a first terminal coupled to the second quadrature-phase signal and a second terminal receiving the second control voltage.

2. The quadrature VCO of claim 1, wherein the first differential VCO comprises:

a first transistor including a first terminal, a second terminal for outputting the first in-phase signal, and a third terminal coupled to the first current source, the first transistor varying a magnitude and a direction of a current which flows from the second terminal to the third terminal according to a voltage applied to the first terminal;

a second transistor including a first terminal coupled to the second terminal of the first transistor, a second terminal being coupled to the first terminal of the first transistor and outputting the second in-phase signal, and a third terminal coupled to the first current source, the second transistor varying a magnitude and a direction of a current which flows from the second terminal to the third terminal according to a voltage applied to the first terminal; and the second differential VCO comprises:

a third transistor including a first terminal, a second terminal for outputting the first quadrature-phase signal, and a third terminal coupled to the second current source, the third transistor varying a magnitude and a direction of a current which flows from the second terminal to the third terminal according to a voltage applied to the first terminal;

a fourth transistor including a first terminal coupled to the second terminal of the third transistor, a second terminal being coupled to the first terminal of the third transistor and outputting the second quadrature-phase signal, and a third terminal coupled to the second current source, the fourth transistor varying a magnitude and a direction of a current which flows from the second terminal to the third terminal according to a voltage applied to the first terminal.

3. The quadrature VCO of claim 2, wherein the first to fourth transistors and the first to fourth coupling transistors include NMOS transistors, the first terminal is a gate, the second terminal is a drain, and the third terminal is a source.

4. The quadrature VCO of claim 2, wherein the first to fourth transistors and the first to fourth coupling transistors include PMOS transistors, the first terminal is a gate, the second terminal is a source, and the third terminal is a drain.

* * * * *